United States Patent
Shi et al.

(10) Patent No.: US 11,401,441 B2
(45) Date of Patent: Aug. 2, 2022

(54) CHEMICAL MECHANICAL PLANARIZATION (CMP) COMPOSITION AND METHODS THEREFORE FOR COPPER AND THROUGH SILICA VIA (TSV) APPLICATIONS

(71) Applicant: Versum Materials US, LLC, Tempe, AZ (US)

(72) Inventors: Xiaobo Shi, Tempe, AZ (US); Laura M. Matz, Tempe, AZ (US); Chris Keh-Yeuan Li, Tempe, AZ (US); Ming-Shih Tsai, Tempe, AZ (US); Pao-Chia Pan, Tempe, AZ (US); Chad Chang-Tse Hsieh, Tempe, AZ (US); Rung-Je Yang, Tempe, AZ (US); Blake J. Lew, Tempe, AZ (US); Mark Leonard O'Neill, Tempe, AZ (US); Agnes Derecskei, Tempe, AZ (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days.

(21) Appl. No.: 16/101,869

(22) Filed: Aug. 13, 2018

(65) Prior Publication Data
US 2019/0055430 A1 Feb. 21, 2019

Related U.S. Application Data

(60) Provisional application No. 62/546,914, filed on Aug. 17, 2017.

(51) Int. Cl.
*C09G 1/02* (2006.01)
*H01L 21/321* (2006.01)

(52) U.S. Cl.
CPC ............ *C09G 1/02* (2013.01); *H01L 21/3212* (2013.01)

(58) Field of Classification Search
CPC .................................. C09G 1/02; C09G 1/00
See application file for complete search history.

(56) References Cited

U.S. PATENT DOCUMENTS 6,773,476 B2 8/2004 Sakai et al.
7,955,520 B2 6/2011 White et al.
(Continued)

FOREIGN PATENT DOCUMENTS

EP 1775337 A1 4/2007
EP 2977418 A1 1/2016
(Continued)

OTHER PUBLICATIONS

Santos, M. Amelia; "Hydroxypyridinones as "privileged" chelating structures for the design of medicinal drugs," Coordination Chemistry Reviews 256 (2012) pp. 240-259.

*Primary Examiner* — Thomas T Pham
(74) *Attorney, Agent, or Firm* — Lina Yang (57) ABSTRACT

Provided are Chemical Mechanical Planarization (CMP) formulations that offer high and tunable Cu removal rates and low copper dishing for the broad or advanced node copper or Through Silica Via (TSV). The CMP compositions provide high selectivity of Cu film vs. other barrier layers, such as Ta, TaN, Ti, and TiN, and dielectric films, such as TEOS, low-k, and ultra low-k films. The CMP polishing formulations comprise solvent, abrasive, at least three chelators selected from the group consisting of amino acids, amino acid derivatives, organic amine, and combinations therefor; wherein at least one chelator is an amino acid or an amino acid derivative. Additionally, organic quaternary ammonium salt, corrosion inhibitor, oxidizer, pH adjustor and biocide are used in the formulations.

2 Claims, 4 Drawing Sheets

(56) References Cited

U.S. PATENT DOCUMENTS

| | | |
|---|---|---|
| 8,236,695 B2 | 8/2012 | Liu et al. |
| 8,435,421 B2 | 5/2013 | Keleher et al. |
| 8,679,980 B2 | 3/2014 | Raman et al. |
| 8,791,019 B2 | 7/2014 | Nomura et al. |
| 8,974,692 B2 * | 3/2015 | Shi .................... B24B 1/00 |
| | | 252/79.4 |
| 9,305,806 B2 | 4/2016 | Shi et al. |
| 10,465,096 B2 * | 11/2019 | Shi .................. H01L 21/3212 |
| 2004/0175942 A1 | 9/2004 | Chang et al. |
| 2006/0046490 A1 * | 3/2006 | Banerjee ................. C11D 7/20 |
| | | 438/692 |
| 2006/0141790 A1 * | 6/2006 | Kim ........................ C09G 1/02 |
| | | 438/691 |
| 2008/0311750 A1 * | 12/2008 | Izumi .................. C09K 3/1463 |
| | | 438/693 |
| 2009/0203566 A1 | 8/2009 | Lee et al. |
| 2010/0221918 A1 | 9/2010 | Takemura et al. |
| 2012/0094490 A1 | 4/2012 | Choi et al. |
| 2013/0078811 A1 | 3/2013 | Bates et al. |
| 2013/0092651 A1 | 4/2013 | Bates et al. |
| 2013/0157919 A1 | 6/2013 | Mellies et al. |
| 2013/0280910 A1 | 10/2013 | Ihnfeldt |
| 2015/0004788 A1 * | 1/2015 | Shi .......................... C09G 1/02 |
| | | 438/693 |
| 2016/0314989 A1 * | 10/2016 | Shi .......................... C09G 1/02 |

FOREIGN PATENT DOCUMENTS

| | | |
|---|---|---|
| EP | 3088486 A1 | 2/2016 |
| TW | 385226 B | 11/2013 |

\* cited by examiner

CHEMICAL MECHANICAL PLANARIZATION (CMP) COMPOSITION AND METHODS THEREFORE FOR COPPER AND THROUGH SILICA VIA (TSV) APPLICATIONS

CROSS REFERENCE TO RELATED APPLICATIONS

This application claims priority to U.S. provisional application 62/546,914 filed on Aug. 17, 2017, the entire contents of which is incorporated herein by reference thereto for all allowable purposes.

BACKGROUND OF THE INVENTION

This invention relates generally to the chemical-mechanical planarization or chemical-mechanical polishing (CMP) of semiconductor wafers. More specifically, present invention relates to high and tunable removal rates and low dishing formulations for the broad or advanced node copper or Through Silica Via (TSV) CMP applications. CMP polishing, CMP polishing formulations, CMP polishing compositions or CMP polishing slurries are interchangeable in present invention.

Copper is the current material of choice for interconnect metal used in the fabrication of integrated electronic devices due to its low resistivity, high reliability, and scalability. Copper chemical mechanical planarization processes are necessary to remove copper overburden from inlaid trench structures while achieving global planarization with low metal loss.

With advancing technology nodes the need to reduce metal dishing and metal loss becomes increasingly important. Any new polishing formulations must also maintain high removal rates, high selectivity to the barrier material and low defectivity.

Copper CMP have been done in the prior arts, for example, in. U.S. Pat. No. 9,305,806; US20160314989; US20130092651; US 20130078811; U.S. Pat. Nos. 8,679,980; 8,791,019; 8,435,421; 7,955,520; US 20130280910; US 20100221918; U.S. Pat. No. 8,236,695; TW 1385226; US 20120094490; U.S. Pat. No. 7,955,520; US US20040175942, U.S. Pat. Nos. 6,773,476, and 8,236,695.

However, the disclosed formulations were unable to meet the performance requirements of high removal rates and low dishing which become more and more challenging for advanced technology nodes.

This invention discloses bulk copper CMP polishing formulations developed to meet challenging requirements of low dishing and high removal rates for the advanced technology nodes.

BRIEF SUMMARY OF THE INVENTION

Described herein are CMP polishing compositions, methods and systems for the copper or Through Silica Via (TSV) CMP applications.

In one aspect, the invention herein provides a copper bulk chemical mechanical polishing (CMP) or Through Silica Via (TSV) composition comprises:
a) abrasive;
b) tris chelators;
c) corrosion inhibitor;
d) organic quaternary ammonium salt;
e) oxidizing agent;
f) biocide; and
g) water; optionally
h) pH adjusting agent;
wherein
the tris chelators are selected from the group consisting of amino acids, amino acid derivatives, organic amine, and combinations therefor; wherein at least one chelator is an amino acid or an amino acid derivative; and
the pH of the composition is from 3.0 to 12.0; preferably from 5.5 to 7.5; and more preferably from 7.0 to 7.35.

In another aspect, the invention provides a method of chemical mechanical polishing at least one copper or copper-containing surface of a semiconductor substrate, using a chemical mechanical polishing or Through Silica Via (TSV) composition comprising steps of:
1. providing the semiconductor substrate;
2. providing a polish pad;
3. providing the chemical mechanical polishing or Through Silica Via (TSV) composition comprising
   a) abrasive;
   b) tris chelators;
   c) corrosion inhibitor;
   d) organic quaternary ammonium salt;
   e) oxidizing agent;
   f) biocide; and
   g) water; optionally
   h) pH adjusting agent;
   wherein
      the tris chelators are selected from the group consisting of amino acids, amino acid derivatives, organic amine, and combinations therefor; wherein at least one chelator is an amino acid or an amino acid derivative; and
      the pH of the composition is from 3.0 to 12.0; preferably from 5.5 to 7.5; and more preferably from 7.0 to 7.35;
4. contacting the at least one copper or copper-containing surface with the polish pad and the chemical mechanical polishing composition; and
5. polishing the at least one copper or copper-containing surface;
wherein at least a portion of the surface is in contact with both the polishing pad and the chemical mechanical polishing composition.

In yet another aspect, the invention provides a method of a selective chemical mechanical polishing comprising steps of:
a) providing a semiconductor substrate having at least one surface containing a first material and at least one second material;
b) providing a polishing pad;
c) providing a chemical mechanical polishing or Through Silica Via (TSV) composition comprising
   1) abrasive;
   2) tris chelators;
   3) corrosion inhibitor;
   4) organic quaternary ammonium salt;
   5) oxidizing agent;
   6) biocide; and 7) water; optionally
8) pH adjusting agent;
wherein
the tris chelators are selected from the group consisting of amino acids, amino acid derivatives, organic amine, and combinations therefor;
wherein at least one chelator is an amino acid or an amino acid derivative; and
the pH of the composition is from 3.0 to 12.0; preferably from 5.5 to 7.5;
and more preferably from 7.0 to 7.35; and the pH of the Cu polishing compositions is from about 3.0 to about 12.0;
d) contacting the at least one surface with the polish pad and the chemical mechanical polishing composition;
e) polishing the at least one surface to selectively remove the first material;
wherein of removal rate of the first material to removal rate of the second material is equal or greater than 500:1; preferably 1000:1; and more preferably 3000:1; and
the first material is copper and the second material is selected from the group consisting of barrier layer such as Ta, TaN, Ti, and TiN film, dielectric layer such as TEOS, low-k, and ultra low-k film.

In yet another aspect, the invention provides a system of chemical mechanical polishing at least one copper or copper-containing surface of a semiconductor substrate, comprising
1. the semiconductor substrate;
2. a polish pad;
3. a chemical mechanical polishing or Through Silica Via (TSV) composition comprising
   a) abrasive;
   b) tris chelators;
   c) corrosion inhibitor;
   d) organic quaternary ammonium salt;
   e) biocide; and
   f) water; optionally
   g) pH adjusting agent;
   wherein
   the tris chelators are selected from the group consisting of amino acids, amino acid derivatives, organic amine, and combinations therefor; wherein at least one chelator is an amino acid or an amino acid derivative; and
   the pH of the composition is from 3.0 to 12.0; preferably from 5.5 to 7.5; and more preferably from 7.0 to 7.35;
wherein at least a portion of the at least one copper or copper-containing surface is in contact with both the polishing pad and the chemical mechanical polishing or Through Silica Via (TSV) composition.

The abrasive particles used for the disclosed herein Cu bulk CMP polishing compositions include, but are not limited to, the following: colloidal silica or high purity colloidal silica; the colloidal silica particles doped by other metal oxide within lattice of the colloidal silica, such as alumina doped silica particles; colloidal aluminum oxide including alpha-, beta-, and gamma-types of aluminum oxides; colloidal and photoactive titanium dioxide, cerium oxide, colloidal cerium oxide, nano-sized inorganic metal oxide particles, such as alumina, titania, zirconia, ceria etc.; nano-sized diamond particles, nano-sized silicon nitride particles; mono-modal, bi-modal, multi-modal colloidal abrasive particles; organic polymer-based soft abrasives, surface-coated or modified abrasives, or other composite particles, and mixtures thereof.

The organic quaternary ammonium salt, includes but is not limited to choline salt, such as choline bicarbonate salt, or all other salts formed between choline and other anionic counter ions.

The corrosion inhibitors include but are not limited to family of hetero aromatic compounds containing nitrogen atom(s) in their aromatic rings, such as 1,2,4-triazole, benzotriazole and benzotriazole derivatives, tetrazole and tetrazole derivatives, imidazole and imidazole derivatives, benzimidazole and benzimidazole derivatives, pyrazole and pyrazole derivatives, and tetrazole and tetrazole derivatives.

The biocide includes but is not limited to Kathon™, Kathon™ CG/ICP II, from Dow Chemical Co. They have active ingredients of 5-chloro-2-methyl-4-isothiazolin-3-one and 2-methyl-4-isothiazolin-3-one.

The oxidizing agent includes, but is not limited to, periodic acid, hydrogen peroxide, potassium iodate, potassium permanganate, ammonium persulfate, ammonium molybdate, ferric nitrate, nitric acid, potassium nitrate, and mixtures thereof.

The amino acids and amino acid derivatives included, but not limited to, glycine, D-alanine, L-alanine, DL-alanine, beta-alanine, valine, leucine, isoleucine, phenylamine, proline, serine, threonine, tyrosine, glutamine, asparanine, glutamic acid, aspartic acid, tryptophan, histidine, arginine, lysine, methionine, cysteine, iminodiacetic acid, and combinations thereof.

The organic amines chelators have general molecular structures, as depicted below:

The organic amine molecules have two primary amine functional groups as terminal groups on both ends of the molecules. n is numbered from 2 to 12, such as ethylenediamine with n=2, propylenediamine with n=3, butylenediamine with n=4, etc.

The organic diamine compounds with two primary amine moieties can be described as the binary chelating agents.

The alkyl group which linked to two terminal primary amine functional groups also include the branched alkyl groups, the general molecular structures of these branched alkyl groups are depicted at followings:

wherein, Rn represents an organic alkyl group in which n can be numbered from 1 to 12, m has the numbers ranged from 2 to 12.

The organic diamine molecules can also have the branched alkyl group as the linking group between two terminal primary amine functional groups.

Another structure of the organic amine molecules is shown below. Rn and Rm can be the same alkyl groups; wherein n and m can be numbered from 1 to 12. Rn and Rm can also be different with different n and m numbers in the same organic diamine molecule.

Another type of the branched alkyl group linker has the following general molecular structure:

wherein, the Rn and Rm groups are bonded to the same carbon atom. Rn and Rm can be the same alkyl groups with n and m numbered independently from 1 to 12. Rn and Rm can also be different with different n and m numbers in the same organic diamine molecule.

The organic diamine molecules with other molecular structures can be also used as a chelating agent in the invented herein Cu CMP slurries, such as those organic diamine molecules with the following general molecular structures:

Such organic diamine molecules can haven numbered from 1 to 12, and can be described as organic diamines with one terminal primary amine functional group and another primary organic amine attached to the beta carbon atoms on the other end of the molecules. Also, the secondary primary amine functional groups can be also bonded to the other carbon atoms at other positions, such as beta, gamma etc. and the first primary amine function group still maintains as the terminal primary amine functional group in the same molecules.

Any other non-aromatic organic diamine molecules with two primary organic amine groups can be used as one of the three chelating agents in the invented Cu CMP slurries herein.

Optionally, any aromatic organic molecules with two primary amine functional groups can be used as one of three chelating agents in the invented Cu CMP slurries herein. For example, aromatic organic amines have the general molecular structures as depicted in followings:

or as followings:

In the above listed general aromatic organic diamine structures with two primary amine functional groups at ortho or meta positions in which n can be from 1 to 12, and m also can be from 1 to 12, also in the same molecule(s), n can be equal to m. In other cases, n can also be different from m.

DETAILED DESCRIPTION OF THE INVENTION

As industry standards trend toward smaller device features, there is a continuously developing need for new Cu bulk metal polishing slurries that afford high and tunable Cu removal rates and low Cu dishing for the broad and advanced node applications.

The copper bulk CMP or Through Silica Via (TSV) polishing compositions described herein satisfy the need for high and tunable Cu film removal rates, for high selectivity between copper and dielectric films, for high selectivity between copper and barrier films, for low and more uniform Cu line dishing across various wide Cu line features, and for better Cu film corrosion protection through using the suitable corrosion inhibitors.

The Cu CMP polishing compositions comprise tris chelators, i.e. three chelating agents, an organic quaternary ammonium salt as additional Cu dishing and defect reducer, Cu corrosion inhibitor for the efficient Cu corrosion protection, abrasive such as nano-sized high purity colloidal silica, oxidizing agent such as hydrogen peroxide, and water as a solvent.

The Cu CMP polishing compositions provide high and tunable Cu removal rates, and low barrier film and dielectric film removal rates which provide very high and desirable selectivity of Cu film vs. other barrier films, such as Ta, TaN, Ti, and TiN, and dielectric films, such as TEOS, low-k, and ultra low-k films, and low Cu dishing and more uniform Cu dishing across wide Cu line features.

The invented herein Cu chemical mechanical polishing compositions also provide no pad stain Cu CMP performances which allow the extended polish pad life and also allow more stable end-point detections.

The abrasive particles used for the disclosed herein Cu bulk CMP polishing compositions include, but are not limited to, the following: colloidal silica or high purity colloidal silica; the colloidal silica particles doped by other metal oxide within lattice of the colloidal silica, such as alumina doped silica particles; colloidal aluminum oxide including alpha-, beta-, and gamma-types of aluminum oxides; colloidal and photoactive titanium dioxide, cerium oxide, colloidal cerium oxide, nano-sized inorganic metal oxide particles, such as alumina, titania, zirconia, ceria etc.; nano-sized diamond particles, nano-sized silicon nitride particles; mono-modal, bi-modal, multi-modal colloidal abrasive particles; organic polymer-based soft abrasives, surface-coated or modified abrasives, or other composite particles, and mixtures thereof.

The colloidal silica can be made from silicate salts, the high purity colloidal silica can be made from TEOS or TMOS. The colloidal silica or high purity colloidal silica can have narrow or broad particle size distributions with mono- model or multi-models, various sizes and various shapes including spherical shape, cocoon shape, aggregate shape and other shapes, The nano-sized particles also can have different shapes, such as spherical, cocoon, aggregate, and others.

The Cu bulk CMP polishing compositions of this invention preferably contain 0.0025 wt. % to 25 wt. % abrasives; the preferred concentration of abrasives ranges from 0.0025 wt. % to 2.5 wt. %. The most preferred concentration of abrasives ranges from 0.005 wt. % to 0.15 wt. %.

An organic quaternary ammonium salt, includes but is not limited to choline salt, such as choline bicarbonate salt, or all other salts formed between choline and other anionic counter ions.

The choline salts can have the general molecular structures shown below:

wherein anion Y⁻ can be bicarbonate, hydroxide, p-toluene-sulfonate, bitartrate, and other suitable anionic counter ions.

The CMP slurry contains 0.005 wt. % to 0.25 wt. % quaternary ammonium salt; the preferred concentration ranges from 0.001 wt. % to 0.05 wt. %; and the most preferred concentration ranges from 0.002 wt. % to 0.01 wt. %

Various per-oxy inorganic or organic oxidizing agents or other types of oxidizing agents can be used to oxidize the metallic copper film to the mixture of copper oxides to allow their quick reactions with chelating agents and corrosion inhibitors. The oxidizing agent includes, but is not limited to, periodic acid, hydrogen peroxide, potassium iodate, potassium permanganate, ammonium persulfate, ammonium molybdate, ferric nitrate, nitric acid, potassium nitrate, and mixtures thereof. The preferred oxidizer is hydrogen peroxide.

The CMP slurry contains 0.1 wt. % to 10 wt. % oxidizing agents; the preferred concentration ranges from 0.25 wt. % to 3 wt. %; and the most preferred concentration ranges from 0.5 wt. % to 2.0 wt. %

The corrosion inhibitors used for the disclosed copper bulk CMP slurry can be those prior arts reported corrosion inhibitors. The corrosion inhibitors include, but are not limited to family of hetero aromatic compounds containing nitrogen atom(s) in their aromatic rings, such as 1,2,4-triazole, benzotriazole and benzotriazole derivatives, tetrazole and tetrazole derivatives, imidazole and imidazole derivatives, benzimidazole and benzimidazole derivatives, pyrazole and pyrazole derivatives, and tetrazole and tetrazole derivatives.

The CMP slurry contains 0.005 wt. % to 0.5 wt. % corrosion inhibitor; the preferred concentration ranges from 0.01 wt. % to 0.1 wt. %; and the most preferred concentration ranges from 0.025 wt. % to 0.05 wt. %

A biocide having active ingredients for providing more stable shelf time of the invented Cu chemical mechanical polishing compositions can be used.

The biocide includes but is not limited to Kathon™, Kathon™ CG/ICP II, from Dow Chemical Co. They have active ingredients of 5-chloro-2-methyl-4-isothiazolin-3-one and 2-methyl-4-isothiazolin-3-one.

The CMP slurry contains 0.0001 wt. % to 0.05 wt. % biocide; the preferred concentration ranges from 0.0002 wt. % to 0.025 wt. %; and the most preferred concentration ranges from 0.002 wt. % to 0.01 wt. %

Optionally, acidic or basic compounds or pH adjusting agents can be used to allow pH of Cu bulk CMP polishing compositions being adjusted to the optimized pH value, The pH adjusting agents include, but are not limited to, the following: nitric acid, hydrochloric acid, sulfuric acid, phosphoric acid, other inorganic or organic acids, and mixtures thereof. pH adjusting agents also include the basic pH adjusting agents, such as sodium hydride, potassium hydroxide, ammonium hydroxide, tetraalkyl ammonium hydroxide, organic amines, and other chemical reagents that are able to be used to adjust pH towards the more alkaline direction.

The CMP slurry contains 0 wt. % to 1 wt. % pH adjusting agent; the preferred concentration ranges from 0.01 wt. % to 0.5 wt. %; and the most preferred concentration ranges from 0.1 wt. % to 0.25 wt. % pH of the Cu polishing compositions is from about 3.0 to about 12.0; preferred pH range is from 5.5 to 7.5; and the most preferred pH range is from 7.0 to 7.35.

The CMP slurry contains 0.1 wt. % to 18 wt. % of three chelators; the preferred concentration ranges from 0.5 wt. % to 10 wt. %; and the most preferred concentration ranges from 1.0 wt. % to 2.5 wt. %.

The three chelators are selected from the group consisting of amino acids, amino acid derivatives, organic amine, and combinations therefor; wherein at least one chelator is an amino acid or an amino acid derivative. For example, the three or tris-chelators, can be the combination of any three amino acids, three amino acid derivatives, or two amino acids plus one organic amine, or one amino acid plus one amino acid derivative plus one organic amine, or two organic amines plus one amino acid, and or two organic amines plus one amino acid derivative. As a specific example, the tris chelators can be glycine, alanine and ethylenediamine.

The three chelators used as complexing agents to maximize their reactions with the oxidized Cu film surfaces to form softer Cu-chelator layers to be quickly removed during Cu CMP process thus achieving high and tunable Cu removal rates and low copper dishing for the broad or advanced node copper or TSV (Through Silica Via) CMP applications.

The amino acids and amino acid derivatives included, but not limited to, glycine, D-alanine, L-alanine, DL-alanine, beta-alanine, valine, leucine, isoleucine, phenylamine, proline, serine, threonine, tyrosine, glutamine, asparanine, glutamic acid, aspartic acid, tryptophan, histidine, arginine, lysine, methionine, cysteine, iminodiacetic acid, etc.

The organic amines chelators have general molecular structures, as depicted below:

The organic amine molecules have two primary amine functional groups as terminal groups on both ends of the molecules. n is numbered from 2 to 12, such as ethylenediamine with n=2, propylenediamine with n=3, butylenediamine with n=4, etc.

The organic diamine compounds with two primary amine moieties can be described as the binary chelating agents.

The alkyl group which linked to two terminal primary amine functional groups also include the branched alkyl groups, the general molecular structures of these branched alkyl groups are depicted at followings:

wherein, Rn represents an organic alkyl group in which n can be numbered from 1 to 12, m has the numbers ranged from 2 to 12.

The organic diamine molecules can also have the branched alkyl group as the linking group between two terminal primary amine functional groups.

Another structure of the organic amine molecules is shown below. Rn and Rm can be the same alkyl groups with n and m numbered independently from 1 to 12. Rn and Rm can also be different with different n and m numbers in the same organic diamine molecule.

Another type of the branched alkyl group linker has the following general molecular structure:

wherein, the Rn and Rm groups are bonded to the same carbon atom. Rn and Rm can be the same alkyl groups with n and m numbered independently from 1 to 12. Rn and Rm can also be different with different n and m numbers in the same organic diamine molecule can be numbered from 2 to 12.

The organic diamine molecules with other molecular structures can be also used as a chelating agent in the invented herein Cu CMP slurries, such as those organic diamine molecules with the following general molecular structures:

Such organic diamine molecules can have n numbered independently from 1 to 12 and can be described as organic diamines with one terminal primary amine functional group and another primary organic amine attached to the beta carbon atoms on the other end of the molecules. Also, the secondary primary amine functional groups can be also bonded to the other carbon atoms at other positions, such as beta, gamma etc. and the first primary amine function group still maintains as the terminal primary amine functional group in the same molecules.

Any other non-aromatic organic diamine molecules with two primary organic amine groups can be used as one of the three chelating agents in the invented Cu CMP slurries herein.

Optionally, any aromatic organic molecules with two primary amine functional groups can be used as one of three chelating agents in the invented Cu CMP slurries herein. For example, aromatic organic amines have the general molecular structures as depicted in followings:

or as followings:

In the above listed general aromatic organic diamine structures with two primary amine functional groups at ortho or meta positions in which n can be from 1 to 12, and m also can be from 1 to 12, also in the same molecule(s), n can be equal to m. In other cases, n can also be different from m.

The associated methods described herein entail use of the aforementioned composition for chemical mechanical planarization of substrates comprised of copper. In the methods, a substrate (e.g., a wafer with Cu surface or Cu plug) is placed face-down on a polishing pad which is fixedly attached to a rotatable platen of a CMP polisher. In this manner, the substrate to be polished and planarized is placed in direct contact with the polishing pad. A wafer carrier system or polishing head is used to hold the substrate in place and to apply a downward pressure against the backside of the substrate during CMP processing while the platen and the substrate are rotated. The polishing composition (slurry) is applied (usually continuously) on the pad during CMP processing to effect the removal of material to planarize the substrate.

The polishing composition and associated methods described herein are effective for CMP of a wide variety of substrates, including most of substrates having, particularly useful for polishing copper substrates.

Experimental Section

Polishing Pad Polishing pad, IC1010 pad or Other polishing pad was used during Cu CMP, supplied by Dow Chemicals Company.

Parameters

Å: angstrom(s)—a unit of length
BP: back pressure, in psi units

CMP: chemical mechanical planarization=chemical mechanical polishing
CS: carrier speed
DF: Down force: pressure applied during CMP, units psi
min: minute(s)
ml: milliliter(s)
mV: millivolt(s)
psi: pounds per square inch
PS: platen rotational speed of polishing tool, in rpm (revolution(s) per minute)
SF: polishing composition flow, ml/min
Removal Rates
Cu RR 1.5 psi Measured Copper removal rate at 1.5 psi down pressure of the CMP tool
Cu RR 2.5 psi Measured Copper removal rate at 2.5 psi down pressure of the CMP tool General Experimental Procedure All percentages are weight percentages unless otherwise indicated. In the examples presented below, CMP experiments were run using the procedures and experimental conditions given below. The CMP tool that was used in the examples is a 300 mm LK® polisher, or a Mirra® polisher, manufactured by Applied Materials, 3050 Boweres Avenue, Santa Clara, Calif., 95054. An IC1010 pad or other type of polishing pad, supplied by Dow Chemicals Company was used on the platen for the blanket wafer polishing studies. Pads were broken-in by polishing twenty-five dummy oxide (deposited by plasma enhanced CVD from a TEOS precursor, PETEOS) wafers. In order to qualify the tool settings and the pad break-in, two PETEOS monitors were polished with Syton® OX-K colloidal silica, supplied by Planarization Platform of Air Products Chemicals Inc. at baseline conditions. Polishing experiments were conducted using blanket Cu wafers with 10.8K Angstroms in thickness, Ta and TEOS blanket wafers. These blanket wafers were purchased from Silicon Valley Microelectronics, 1150 Campbell Ave, Calif., 95126.

Working Example

In following working examples, the Cu slurry composition with single chelator comprised 0.713 wt. % of glycine, 0.0323 wt. % of 1,2,4-triazole, 0.00644 wt. % of high purity colloidal silica, and 0.00018 wt. % of biocide. The Cu slurry #1 composition with dual chelators comprised 0.5 wt. % of glycine, 0.70625 wt. % of alanine, 0.03525 wt. % of 1,2,4-triazole, 0.01042 wt. % of high purity colloidal silica, and 0.00016 wt. % of biocide. The Cu slurry #2 composition with tris chelators comprised of 0.5 wt. % of glycine, 0.70625 wt. % of alanine, 0.0012 wt. % of ethylenediamine, 0.00289 wt. % of choline bicarbonate, 0.03525 wt. % of 1,2,4-triazole, 0.01042 wt. % of high purity colloidal silica, and 0.00016 wt. % of biocide.

All these three listed formulations used 1.0 wt. % of $H_2O_2$ as oxidizing agent at point of use, respectively. The CMP polishing compositions had a pH between 7.00 to 7.35.

Example 1

Figure 1:
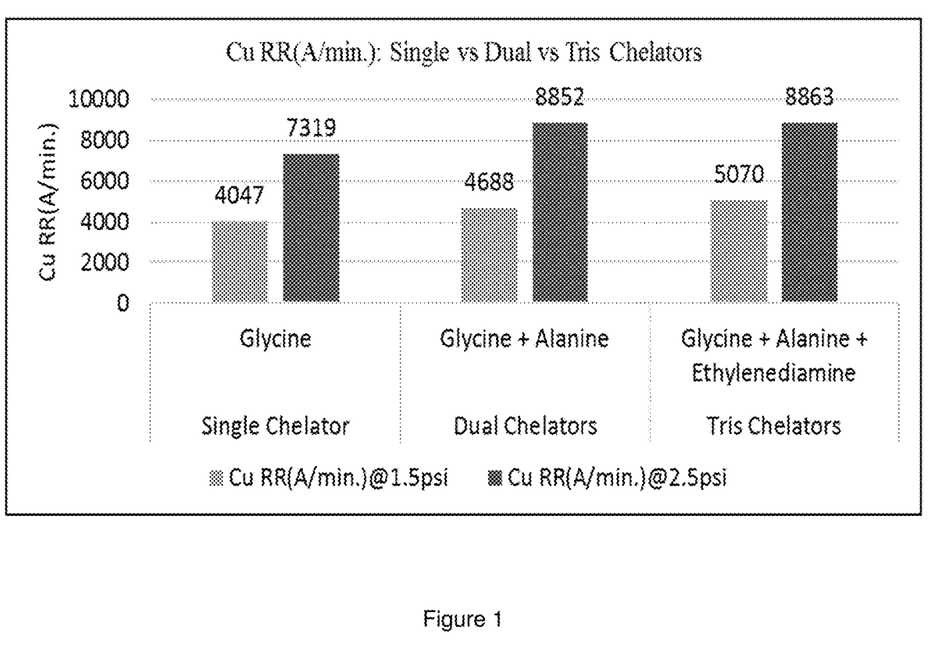
FIG. 1 shows Cu polishing results of formulations with single, dual and tris chelators

The polish results of using the Cu bulk CMP polishing compositions were listed in Table 1 and depicted in FIG. 1.
The single chelator was glycine, the dual chelators were glycine and alanine (alanine includes DL-Alanine; D-Alanine; and L-Alanine), the tris chelators were glycine, alanine and ethylenediamine, in tris chelators based polishing composition, an organic quaternary ammonium salt, choline bicarbonate, was also being used.

TABLE 1

The Effects of Tris or Dual Chelator Cu Slurries vs. Single Chelator Cu Slurry on Cu Removal Rates

| Sample | Cu Removal (Å/min.) at 1.5 psi DF | Cu Removal Rate (Å/min.) at 2.5 psi DF |
|---|---|---|
| Cu Slurry with single chelator, Glycine | 4047 | 7319 |
| Cu Slurry# 1 with dual chelators, Glycine + DL-Alanine | 4688 | 8852 |
| Cu Slurry# 2 with tris chelators, Glycine + DL-Alanine + ethylenediamine + Choline Bicarbonate | 5070 | 8863 |

The Cu CMP polishing compositions herein afforded high and compatible Cu film removal rates when using tris chelators based Cu CMP polishing compositions The dual chelators based Cu slurry provided 16% higher Cu removal rate at 1.5 psi DF than the single chelator based Cu slurry, and 21% higher Cu removal rate at 2.5 psi DF than the single chelator based Cu slurry.

The tris chelators based Cu slurry provided 25% higher Cu removal rate at 1.5 psi DF than the single chelator based Cu slurry, and 22% higher Cu removal rate at 2.5 psi DF than the single chelator based Cu slurry.

Also the tris chelator based Cu slurry provided 8% higher Cu removal rate at 1.5 psi DF than the dual chelators based Cu slurry.

The increased 8% Cu removal rate at 1.5 psi DF mainly resulted from the use of third chelator, ethylenediamine, which is a binary chelating agent and reacts very effectively with Cu oxides to form water soluble Cu-ethylenediamine complexes and being subsequently removed during Cu CMP process.

Example 2

Figure 2:
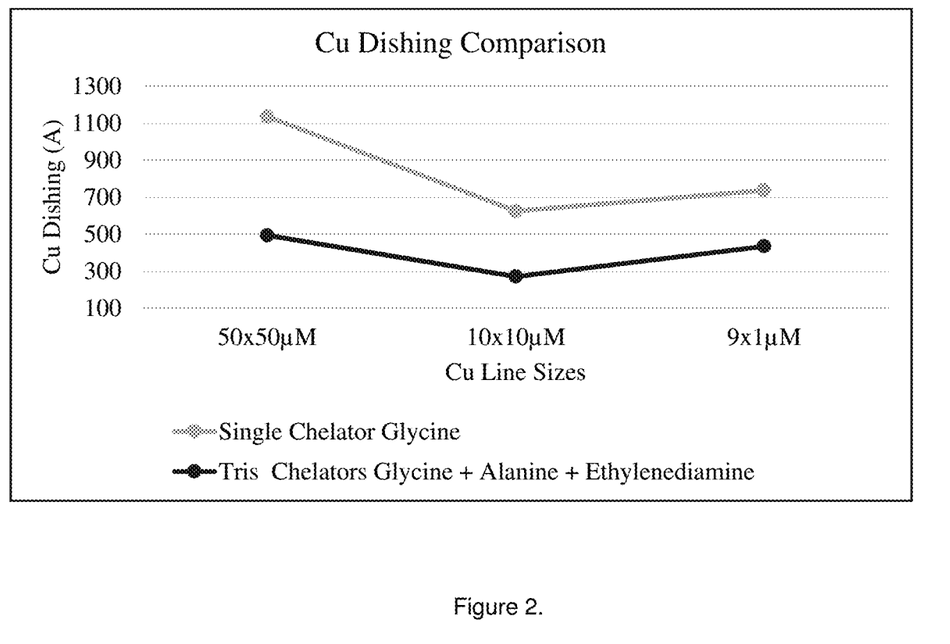
FIG. 2 shows Cu dishing results of formulations with single, and tris chelators
Figure 3:
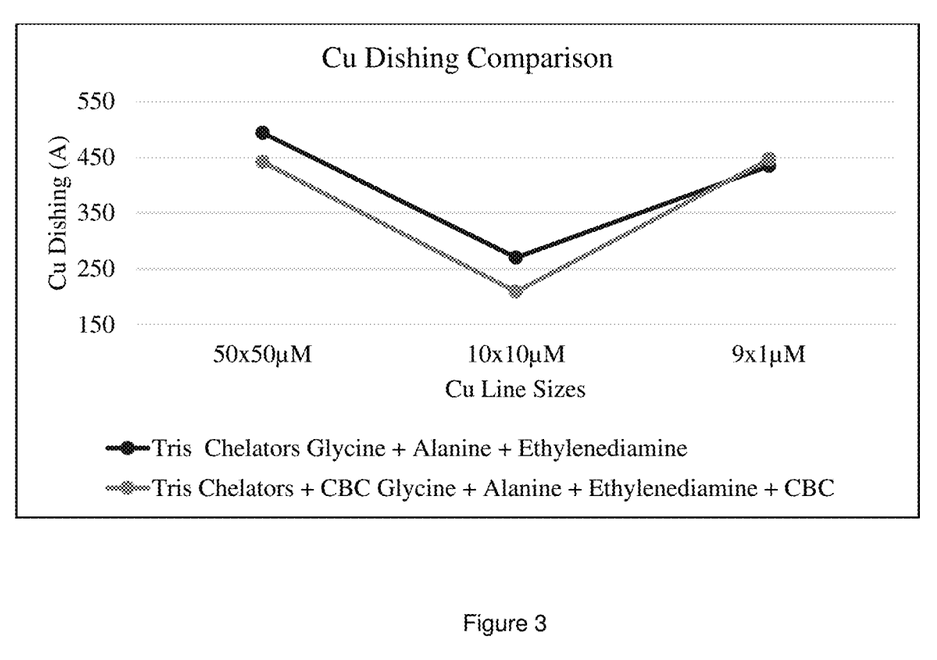
FIG. 3 shows Cu dishing results of formulations with tris chelators with and without choline bicarbonate

The polishing effects of the tris chelator based Cu CMP polishing compositions with/or without choline bicarbonate as an additional additive, and the single chelator based Cu polishing compositions on wide Cu line feature dishing were shown in Table 2, and depicted in FIG. 2 and FIG. 3.

TABLE 2

Wide Cu Line Dishing: Single Chelator Cu Slurry vs Tris Chelator Cu Slurries

| Sample | Averaged Cu Dishing (Å) on 50 × 50 μM | Averaged Cu Dishing (Å) on 10 × 10 μM | Averaged Cu Dishing (Å) on 9 × 1 μM |
|---|---|---|---|
| Cu Slurry#1 with single chelator, Glycine | 1135 | 624 | 737 |
| Cu Slurry# 2 with tris chelators, Glycine + DL-Alanine + EDA | 493 | 270 | 434 |
| Cu Slurry# 3 with tris chelators, Glycine + DL-Alanine + EDA + CBC | 441 | 209 | 446 |

EDA: Ethylenediamine;
CBC: Choline Bicarbonate

As the wide Cu line dishing data showed in Table 2, Cu slurry with tris chelators, glycine/alanine/ethylenediamine provided much lower Cu dishing on wide Cu line features than the Cu slurry only using single chelator, glycine.

On 50×50 μM Cu line feature, the averaged Cu dishing of tris chelators based Cu slurry was reduced by 56.6 wt. % than the Cu slurry only using single chelator, glycine. On 10×10 μM Cu line feature, the averaged Cu dishing of tris chelators based Cu slurry was reduced by 56.7 wt. % than the Cu slurry only using single chelator, glycine. And on 9×1 μM Cu line feature, the averaged Cu dishing of tris chelators based Cu slurry was reduced by 41.1 wt. % than the Cu slurry only using single chelator, glycine.

Further, the use of choline bicarbonate salt in tris chelators based Cu slurry also led to the Cu line dishing reductions on 50×50 μM and 10×10 μM features. The Cu line dishing were reduced by about 11% and 23% respectively on 50×50 μM and 10×10 μM features with the use of choline bicarbonate in glycine/alanine/ethylenediamine based tris chelator Cu slurry.

Also, tris chelators based Cu slurry or tris chelators based Cu slurry with choline bicarbonate afforded more uniform Cu line dishing across three wide Cu line feature. The delta of Cu line dishing among 50×50 μM and 10×10 μM and 9×1 μM Cu line features was 511 Å for Cu slurry using glycine as single chelator, the delta of Cu line dishing among 50×50 μM and 10×10 μM and 9×1 μM Cu line features was 223Å for Cu slurry using glycine/alanine/ethylenediamine as tris chelators, and the delta of Cu line dishing among 50×50 μM and 10×10 μM and 9×1 μM was 232Å for Cu slurry using glycine/alanine/ethylenediamine as tris chelators plus choline bicarbonate as an addition additive to further reduce Cu line dishing on some sized Cu line features.

Example 3

The tris chelator based Cu slurry or tris chelator based Cu slurry with choline bicarbonate salt also reduced Cu defect counts significantly compared to the single chelator based Cu slurry. 0.2 micron Cu defect count results at 1.5 psi DF were listed in Table 3.

Figure 4:
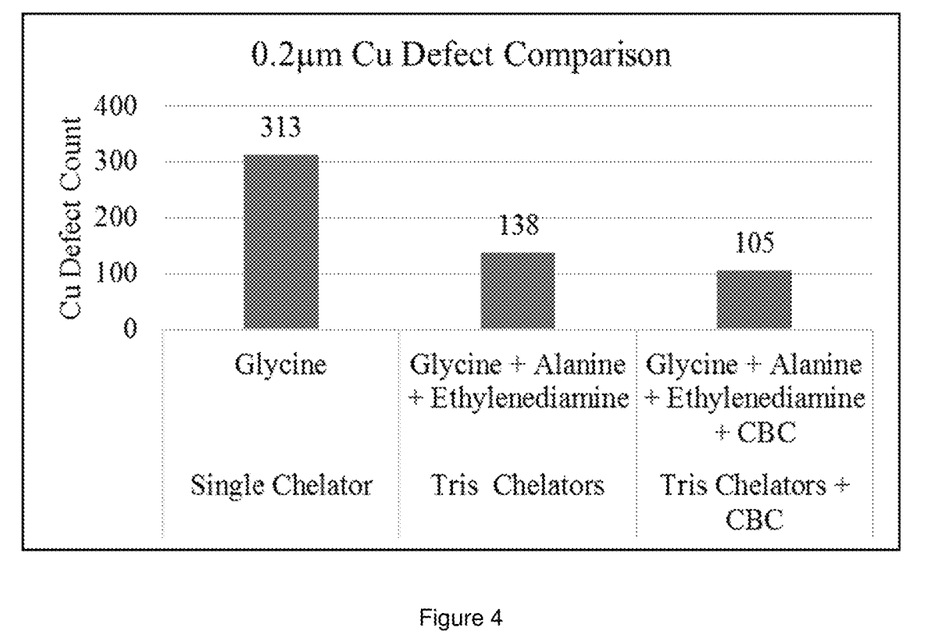
FIG. 4 shows Cu defect count results of formulations with single, dual and tris chelators (0.2 μm)

As the Cu defect count data showed in Table 3 and depicted in FIG. 4, the Cu defect count was reduced by 56 wt. % for glycine/alanine/ethylenediamine based tris chelator Cu slurry than glycine based single chelator Cu slurry. The Cu defect count was reduced by 66.5 wt. % for glycine/alanine/ethylenediamine based tris chelator+choline bicarbonate Cu slurry compared to glycine based single chelator Cu slurry. In other words, Cu defect counts were reduced by 2.2× to 3× in tris chelators or tris chelators plus choline bicarbonate based Cu slurries compared to the single chelator based Cu slurry.

TABLE 3

| Cu Defect Count Comparison of Single Chelator vs Tris Chelator Cu Slurries | |
|---|---|
| Sample | 0.2 μm Cu Defect@.15 psi DF |
| Cu Slurry with single chelator, Glycine | 313 |
| Cu Slurry# 2 with tris chelators, Glycine + DL-Alanine + EDA | 138 |
| Cu Slurry# 2 with tris chelators, Glycine + DL-Alanine + EDA + CBC | 105 |

The use of choline bicarbonate as additional additive in the tris chelator based Cu slurry not only reduced Cu dishing on some wide Cu line features, but also further reduced Cu defect count by 24 wt. % compared to the tris chelators based Cu slurry.

The tris chelators based Cu CMP slurry or tris chelators with choline salt based Cu slurry showed very high selectivity toward barrier films or dielectric films. For example, greater than 500:1 of Cu:Ta selectivity was obtained for the tris chelators based Cu CMP slurry or tris chelators plus choline salt based Cu slurry.

While the invention has been described in conjunction with specific embodiments thereof, it is evident that many alternatives, modifications, and variations will be apparent to those skilled in the art in light of the foregoing description. Accordingly, departures may be made from such details without departing from the spirit or scope of the general inventive concept.

The invention claimed is:

1. A copper chemical mechanical polishing (CMP) composition consisting essentially of:
    a) 0.0025 wt. % to 2.5 wt. % abrasive selected from the group consisting of colloidal silica; the colloidal silica particles doped by other metal oxide within lattice of the colloidal silica; colloidal aluminum oxide including alpha-, beta-, and gamma-types of aluminum oxides; colloidal and photoactive titanium dioxide; cerium oxide; colloidal cerium oxide; nano-sized inorganic metal oxide particles; nano-sized diamond particles; nano-sized silicon nitride particles; mono-modal, bi-modal, multi-modal colloidal abrasive particles; organic polymer-based soft abrasive; surface-coated or modified abrasive; composite particles; and combinations thereof;
    b) 1.0 wt. % to 2.5 wt. % tris chelators of glycine, at least one selected from the group consisting of D-alanine, L-alanine, DL-alanine, and beta-alanine, and at least one selected from the group consisting of ethylenediamine, propylenediamine, and butylenediamine;
    c) 0.001 wt. % to 0.1 wt. % corrosion inhibitor selected from the group consisting of 1,2,4-triazole, benzotriazole and benzotriazole derivatives, tetrazole and tetrazole derivatives, imidazole and imidazole derivatives, benzimidazole and benzimidazole derivatives, pyrazole and pyrazole derivatives, tetrazole and tetrazole derivatives, and combinations thereof;
    d) 0.0005 wt. % to 0.25 wt. % organic quaternary ammonium salt having a general molecular structure shown below: 0.002 wt. % to 0.01 wt. % wherein anion Y⁻ can be bicarbonate, p-toluene-sulfonate, or bitartrate;
    e) 0.25 wt. % to 3.0 wt. % oxidizing agent selected from the group consisting of periodic acid, hydrogen peroxide, potassium iodate, potassium permanganate, ammonium persulfate, ammonium molybdate, ferric nitrate, nitric acid, potassium nitrate, and combinations thereof;
    f) 0.0001 wt. % to 0.05 wt. % biocide selected from the group consisting of 5-chloro-2-methyl-4-isothiazolin-3-one, 2-methyl-4-isothiazolin-3-one, and combinations thereof;

g) 0 wt. % to 1 wt. % pH adjusting agent selected from the group consisting of either (1) nitric acid, hydrochloric acid, sulfuric acid, phosphoric acid, and combinations thereof for adjusting pH toward acidic; or (2) sodium hydride, potassium hydroxide, ammonium hydroxide, tetraalkyl ammonium hydroxide, organic amine, and combinations thereof for adjusting pH toward alkaline; and h) water;

the composition has a pH from 5.5 to 7.5.

2. The copper chemical mechanical polishing (CMP) composition of claim 1, consisting essentially of 0.005 wt. % to 0.15 wt. % of colloidal silica;

0.5 to 1.5 total wt. % of ethylenediamine; glycine and DL-alanine;

0.002 wt. % to 0.01 wt. % of choline bicarbonate salt;

0.5 wt. % to 2.0 wt. % of periodic acid or hydrogen peroxide;

0.025 wt. % to 0.05 wt. % of 1,2,4-triazole or benzotriazole and benzotriazole derivatives;

0.0001 wt. % to 0.05 wt. % of the biocide has an active ingredient selected from the group consisting of 5-chloro-2-methyl-4-isothiazolin-3-one, 2-methyl-4-isothiazolin-3-one, and combinations thereof; and the composition has a pH from 7.0 to 7.35.

\* \* \* \* \*